(12) United States Patent
Wu et al.

(10) Patent No.: US 10,026,838 B2
(45) Date of Patent: Jul. 17, 2018

(54) FIN-TYPE FIELD EFFECT TRANSISTOR AND MANUFACTURING METHOD THEREOF

(71) Applicant: Taiwan Semiconductor Manufacturing Co., Ltd., Hsinchu (TW)

(72) Inventors: Cheng-Ta Wu, Chiayi County (TW); Yung-Yu Wang, Hsinchu (TW); Yung-Hsiang Chan, Hsinchu (TW); Chia-Ying Tsai, Hsinchu (TW); Ting-Chun Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 101 days.

(21) Appl. No.: 15/054,086

(22) Filed: Feb. 25, 2016

(65) Prior Publication Data

US 2017/0250280 A1    Aug. 31, 2017

(51) Int. Cl.
*H01L 29/76* (2006.01)
*H01L 29/78* (2006.01)
*H01L 21/02* (2006.01)
*H01L 21/8234* (2006.01)
*H01L 27/088* (2006.01)

(52) U.S. Cl.
CPC .... *H01L 29/7848* (2013.01); *H01L 21/02236* (2013.01); *H01L 21/823431* (2013.01); *H01L 21/823468* (2013.01); *H01L 21/823481* (2013.01); *H01L 27/0886* (2013.01)

(58) Field of Classification Search
CPC ............ H01L 29/7848; H01L 27/0886; H01L 21/02236; H01L 21/823431; H01L 21/823468; H01L 21/823481; H01L 21/823821; H01L 21/845; H01L 27/0924; H01L 27/10826; H01L 27/10879; H01L 29/41791; H01L 27/1211; H01L 29/66795–29/66818; H01L 29/785–29/7856; H01L 2924/13067; H01L 21/82346
USPC ........ 438/154, 218, 221, 222; 257/401, 369, 257/374
See application file for complete search history.

(56) References Cited

U.S. PATENT DOCUMENTS

2005/0272192 A1*  12/2005  Oh .................... H01L 29/66553
                                                   438/197
2012/0119303 A1*  5/2012  Jangjian ............ H01L 21/02129
                                                   257/384
2013/0214357 A1*  8/2013  Chang ............... H01L 29/66545
                                                   257/347

(Continued)

*Primary Examiner* — Kevin M Picardat
(74) *Attorney, Agent, or Firm* — JCIPRNET (57) ABSTRACT

A fin-type field effect transistor comprising a substrate, at least one gate structure, spacers and strained source and drain regions is described. The at least one gate structure is disposed over the substrate and on the isolation structures. The spacers are disposed on sidewalls of the at least one gate structure. First blocking material layers are disposed on the spacers. The strained source and drain regions are disposed at two opposite sides of the at least one gate structure. Second blocking material layers are disposed on the strained source and drain regions. The first and second blocking material layers comprise oxygen-rich oxide materials.

16 Claims, 5 Drawing Sheets

(56) References Cited

U.S. PATENT DOCUMENTS

2013/0313647 A1* 11/2013 Aquilino ......... H01L 21/823807
257/368
2015/0189207 A1* 7/2015 Chien .................... H04N 5/374
348/308
2016/0163829 A1* 6/2016 Ku .................... H01L 29/66795
438/478

* cited by examiner

FIN-TYPE FIELD EFFECT TRANSISTOR AND MANUFACTURING METHOD THEREOF

BACKGROUND

As the scaling down of conventional planar MOSFETs has encountered problems such as significant drain induced barrier lowering (DIBL), fluctuation of device characteristics, and current leakage, three-dimensional multi-gate structures, such as the fin-type field effect transistor (FinFET), have been developed as alternatives.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of FinFETs and the FinFETs fabricated there-from. The FinFET may be formed on a monocrystalline semiconductor substrate, such as a bulk silicon substrate in certain embodiments of the present disclosure. In some embodiments, the FinFET may be formed on a silicon-on-insulator (SOI) substrate or a germanium-on-insulator (GOI) substrate as alternatives. Also, in accordance with the embodiments, the silicon substrate may include other conductive layers, doped regions or other semiconductor elements, such as transistors, diodes or the like. The embodiments are intended for illustration purposes but not intended to limit the scope of the present disclosure.

Figure 1:
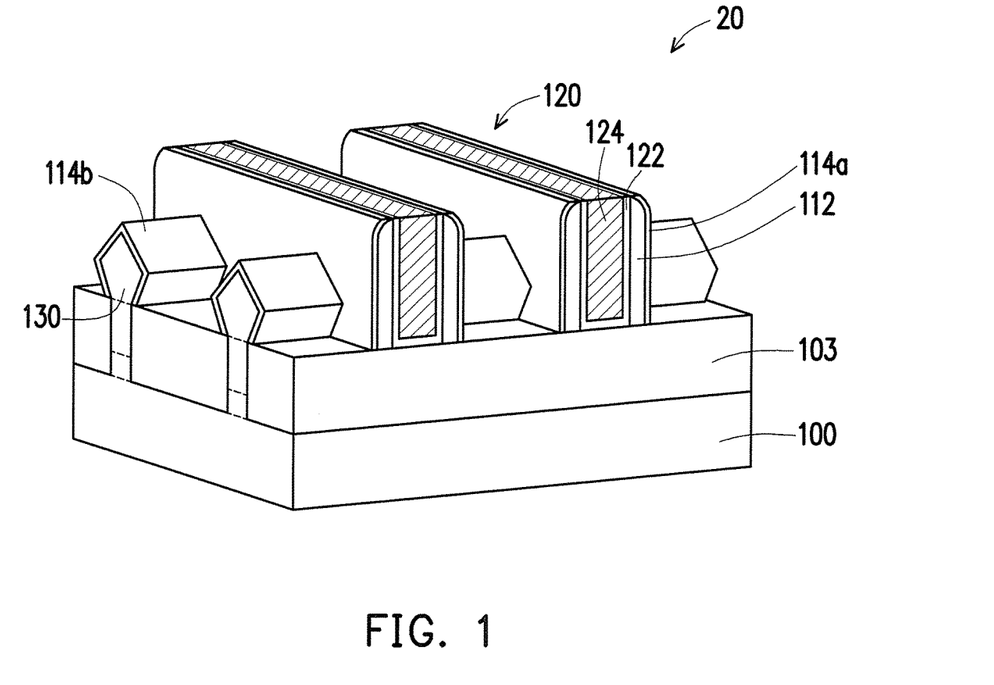
FIG. 1 illustrates a prospective view of an exemplary FinFET in accordance with some embodiments of the present disclosure.

FIG. 1 illustrates a cross-sectional view of an exemplary FinFET in accordance with some embodiments of the present disclosure. FIG. 2A-2G illustrates the FinFET at various stages of the manufacturing methods for forming a FinFET according to some embodiments of the present disclosure. In FIG. 1, the FinFET 20 comprises at least one gate structure 120 formed on a substrate 100, spacers 112 and first blocking material layers 114a formed on opposite sidewalls of the gate structure 120, and a channel region 102 under the gate structure 120. The FinFET 20 comprises strained source and drain regions 130 formed within the substrate 100 and between the isolation structures 103 and second blocking material layers formed on surfaces of the strained sourced and drain regions 130. In some embodiments, the isolation structures 103 are trench isolation structures. In certain embodiments, the trench isolation structures are strip-shaped and arranged in parallel. The strained source and drain regions 130 are located at two opposite sides of the gate structure 120. In some embodiments, the FinFET 20 is a p-channel FinFET. In some embodiments, the FinFET 20 is an n-channel FinFET.

Figure 2A:
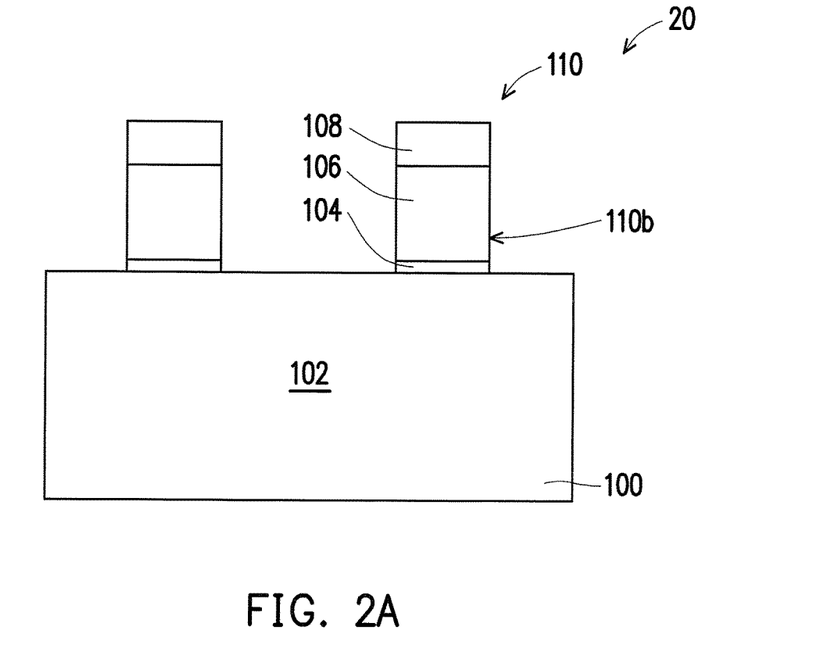
FIGS. 2A-2G are the cross-sectional views and prospective views showing the FinFET at various stages of the manufacturing method for forming a FinFET according to some embodiments of the present disclosure.

In FIG. 2A, a substrate 100 is provided. The substrate 100 is a monocrystalline semiconductor substrate or a SOI substrate, for example. In some embodiments, the substrate 100 is a silicon substrate. The substrate 100 includes isolation structures 103 (FIG. 1) for electrical isolation and fins 102 located between the isolation structures 103. In one embodiment, the fins 102 are formed by etching into the substrate 100 to form trenches. In one embodiment, the isolation structures 103 are formed by filling the trenches in the substrate with a dielectric material, such as silicon oxide or spin-on materials.

Referring to FIG. 2A, the stack structures 110 are formed on the substrate 100 and on the isolation structures 103, and across and over the fins 102. In some embodiments, the stack structures 110 are strip-shaped structures arranged in parallel and the extending direction of the stack structure 110 is perpendicular to the extending direction of the fins 102. In FIG. 2A, two stack structures 110 are shown, and the number of the stack structures 110 are for illustrative purposes but not intended to limit the structure of the present disclosure. In certain embodiments, the stack structure 110 comprises a polysilicon strip 106 and a hard mask strip 108 located on the polysilicon strip 106. In some embodiments, the stack structure 110 is formed by depositing a polysilicon layer (not shown), a hard mask layer (not shown) over the polysilicon layer and then patterning the hard mask layer and the polysilicon layer to form the polysilicon strips 106 and the hard mask strips 108. Optionally, an oxide layer 104 is formed before forming the polysilicon layer to protect the fins 102. In some embodiments, the material of the hard mask layer includes silicon nitride formed by low-pressure chemical vapor deposition (LPCVD) or plasma enhanced chemical vapor deposition (PECVD).

Figure 2B:
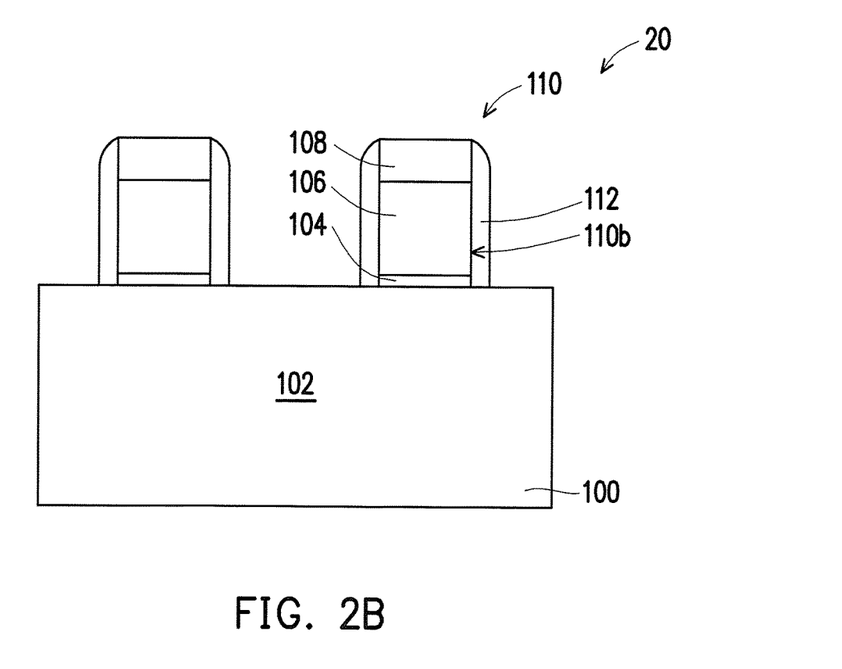

In FIG. 2B, in some embodiments, the spacers 112 are formed on the sidewalls 110b of the stack structure 110. That is, the spacers 112 are formed on the sidewalls of the hard mask strips 108 and the polysilicon strips 106. In one embodiment, the spacers 112 are formed by depositing a conformal dielectric layer (not shown) and then etching back the dielectric layer to form the spacers 112 solely on the sidewalls 110b of the stack structure 110. In some embodiments, the spacers 112 are formed of dielectric materials, such as silicon oxide, silicon nitride, silicon carbon oxynitride (SiCON) or the combination thereof. The spacers 112 may be a single layer or a multilayered structure.

Figure 2C:
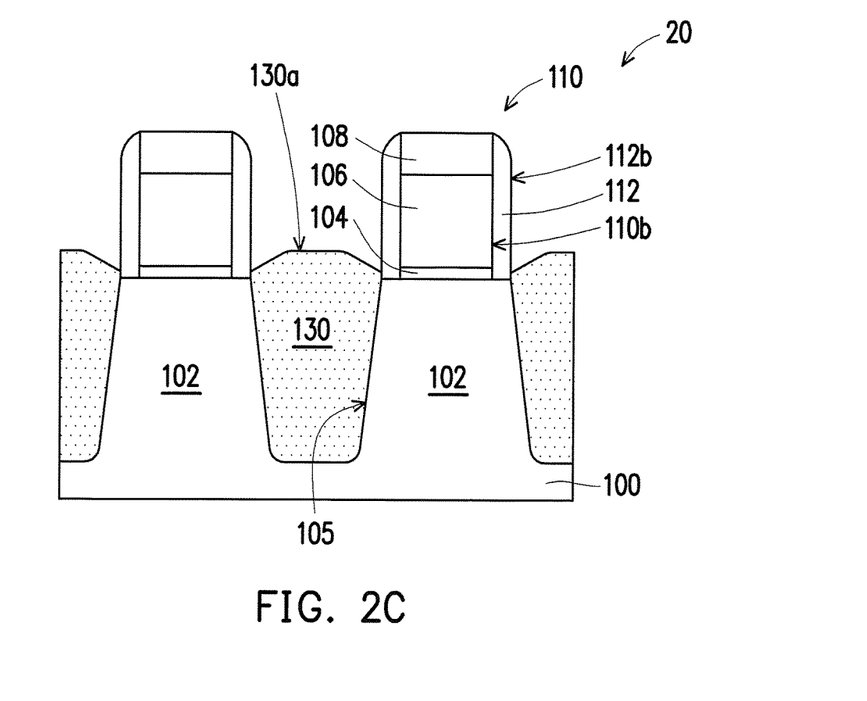

In FIG. 2C, in some embodiments, recesses 105 are formed within the substrate 100 beside the stack structure 110 and the spacers 112 by removing a portion of the substrate 100 at the locations intended for source and drain regions and using the stack structure 110 and the spacers 112 as the etching masks. The recesses 105 are formed by using one or more etching processes, including anisotropic etching, isotropic etching or the combination thereof. In some embodiments, after the formation of the recesses 105 within the substrate 100, the strained source and drain regions 130 are formed by depositing a strained material within the recesses 105 to fill the recesses 105, as shown in FIG. 2C. In some embodiments, some of the strained source and drain regions 130 are slightly protruded out of the substrate 100 and the isolation structures 103. Since the strained source and drain regions 130 are located on opposite sides of the channel region 102 and the lattice constant of the strained material is different from the material of the substrate 100, the channel region 102 is strained or stressed to increase carrier mobility of the device and enhance the device performance. Also, the strained source and drain regions 130 are optionally formed with capping layers (not shown) and the material of the capping layer comprises lightly doped or undoped silicon-containing material, for example.

In certain embodiments, the strained material includes silicon germanium (SiGe), silicon phosphide (SiP) or silicon carbide (SiC). The strained material deposited within the recesses 105 (source and drain regions) is a stress-inducing material, which causes a uniaxial compressive strain to the channel region. The strained material, such as SiGe, is utilized for hole mobility enhancement of a p-channel FinFET. For improving carrier mobility of the p-channel FinFET at higher node development, such as node-28 and below, the content of Ge in SiGe may be adjusted to be within a specific range. Similarly, the strained material, such as SiP, is utilized for electron mobility enhancement of an n-channel FinFET. In some embodiments, the strained source and drain regions 130 are formed through epitaxial growth. In some embodiments, the epitaxial growth technology comprises low pressure CVD (LPCVD), atomic layer CVD (ALCVD), ultrahigh vacuum CVD (UHVCVD), reduced pressure CVD (RPCVD), molecular beam epitaxy (MBE), metalorganic vapor phase epitaxy (MOVPE) or a combination thereof. Alternatively, epitaxial growth technology utilizes cyclic deposition-etch (CDE) epitaxy process or selective epitaxial growth (SEG) process to form the strained material of high crystal quality.

Figure 2D:
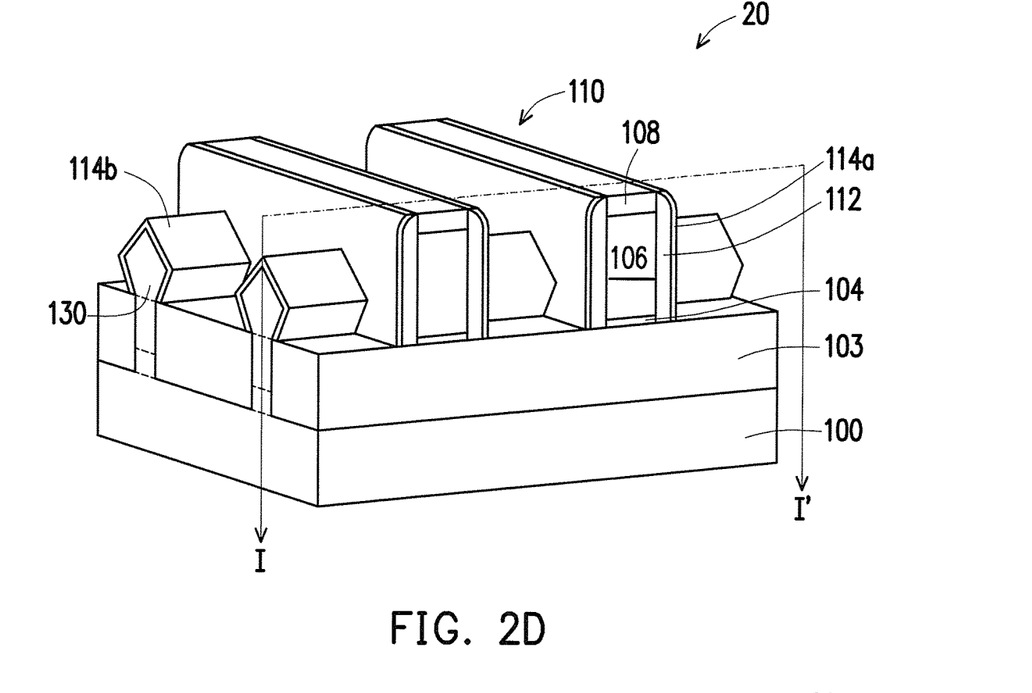
Figure 2E:
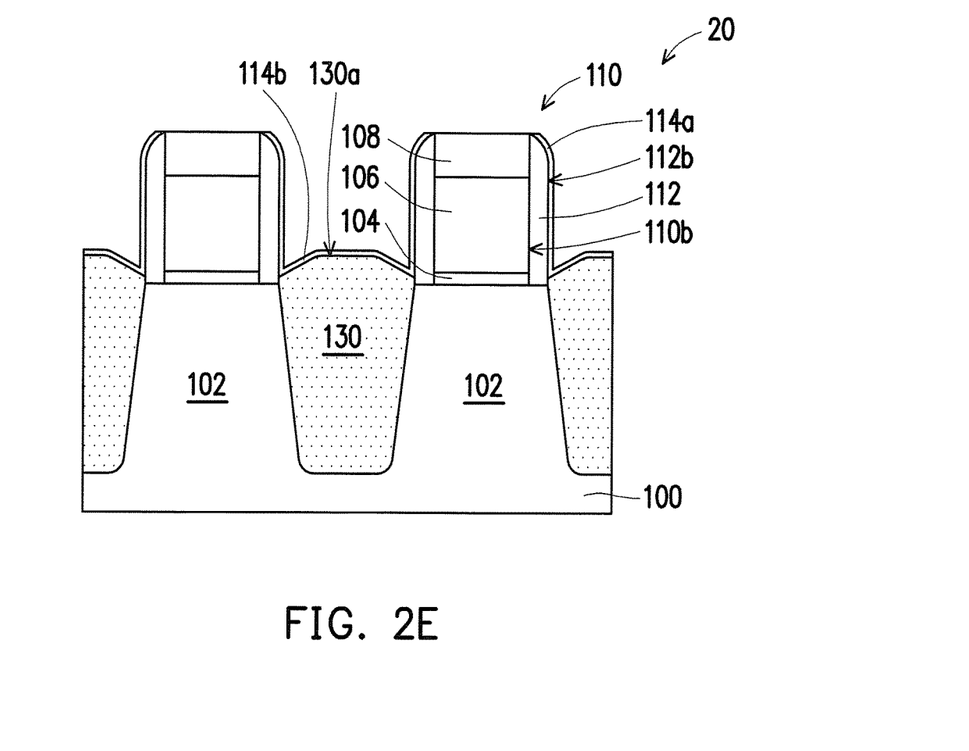

FIG. 2D is a perspective view of the FinFET 20 at one of various stages of the manufacturing method, and FIG. 2E is a cross-sectional view of the FinFET 20 taken along the line I-I' of FIG. 2D. As shown in FIGS. 2D and 2E, first blocking material layers 114a are formed on the surfaces 112b of the spacers 112 and second blocking material layers 114b are formed on the top surfaces 130a of the strained source and drain regions 130. The thickness of the first or second blocking material layers 114a, 114b ranges from about 1 nm to about 50 nm, for example. In certain embodiment, the thickness of the first blocking material layers 114a ranges from 2 nm to 5 nm. In certain embodiments, the thickness of the second blocking material layers 114b ranges from 2 nm to 5 nm. In some embodiments, the first blocking material layers 114a and the second blocking material layers 114b are formed at the same time. In certain embodiments, the first blocking material layers 114a and the second blocking material layers 114b are formed by performing an oxidation treatment to the spacers 112 and the strained source and drain regions 130. In one embodiment, the oxidation treatment is a low temperature radical oxidation treatment, performed with an operating temperature ranging from 25° C. to 600° C. The oxidation treatment process includes applying a plasma treatment using at least a gas containing oxygen (O), for example. In the oxidation treatment process, surfaces of the spacers 112 and/or the strained source and drain regions 130 are oxidized by neutral radicals, ion, electrons or a combination thereof included in the plasma treatment. In some embodiments, the first blocking material layers 114a and the second blocking material layers 114b includes oxygen-rich oxide materials. In some embodiments, the first blocking material layers 114a and the second blocking material layers 114b are formed by performing the oxidation treatment including applying a plasma treatment, and the parameters for the plasma treatment include: at a power of 500 watts to 4000 watts, an operating temperature of 25° C. to 600° C. and an operating pressure of 0.5 torr to 200 torr, with an oxygen gas flow rate of about 0.1 slm to about 30 slm, and a hydrogen gas flow rate of about 0.05 slm to about 10 slm. In alternative embodiments, the first blocking material layers 114a and the second blocking material layers 114b are formed by performing the oxidation treatment including applying a plasma treatment, and the fabrication parameters for the plasma treatment include: supplying an oxygen gas and a hydrogen gas with an oxygen gas flow rate of about 0.1 slm to about 30 slm and a hydrogen gas flow rate of about 0.05 slm to about 10 slm, at a power of 500 watts to 4000 watts, at an operating temperature of 300° C. to 400° C. and an operating pressure of 1 torr to 20 torr.

In some embodiments, the material of the first blocking material layers 114a includes oxide, and the material of the second blocking material layers 114b includes oxide. In some embodiments, the oxygen content of the first blocking material layers 114a is larger than the oxygen content of the spacers 112. In some embodiments, the oxygen content of the second blocking material layers 114b is larger than the oxygen content of the strained source and drain regions 130. In certain embodiments, the material of the first blocking material layers 114a includes oxygen-rich oxide materials, such as oxygen-rich silicon oxide, oxygen-rich silicon nitride, oxygen-rich silicon carbon oxynitride or a combination thereof, for example. In one embodiment, the material of the spacers 112 includes silicon carbon oxynitride (SiCON), and the material of the first blocking material layers 114a includes oxygen-rich SiCON. In one embodiment, the oxygen content of oxygen-rich SiCON is 8% to 40%. In one embodiment, the material of the spacers 112 includes silicon nitride, and the material of the first blocking material layers 114a includes oxygen-rich silicon nitride or oxygen-rich SiON. In one embodiment, the oxygen content of oxygen-rich SiON is 8% to 40%. In alternative embodiment, the material of the spacers 112 includes silicon oxide, and the material of the first blocking material layers 114a includes oxygen-rich silicon oxide. In certain embodiments, the material of the second blocking material layers 114b includes oxygen-rich oxide materials, such as oxygen-rich silicon oxide, oxygen-rich silicon germanium oxide, or a combination thereof. In some embodiments, the oxygen-rich semiconductor material oxide is represented by MOx, where M is Si or Ge, and 2.1≤x≤2.5. In one embodiment, the material of the second blocking material layers 114b is oxygen-rich silicon oxide, SiOx and 2.1≤x≤2.5.

In alternative embodiments, the first blocking material layers 114a and the second blocking material layers 114b include negative-charged layers. In one embodiment, the oxygen-rich oxide materials are negative-charged. In one embodiment, the first blocking material layers 114a include negative-charged SiCON layers or negative-charged silicon oxide layers. In one embodiment, the second blocking material layers 114b include negative-charged silicon oxide layers. In some embodiment, the surface charge contents of the negative-charged layers range from about $-20 \times 10^{10}/cm^2$ to about $-150 \times 10^{10}/cm^2$. Compared with normal or neutral silicon oxide formed by thermal oxidation, lower binding energies are observed for the negative charged silicon oxide.

Through the formation of the first blocking material layers 114a on the spacers 112 and the second blocking material layers 114b covering the surfaces 130a of the strained source and drain regions 130, the electron or hole traps are decreased and the current leakage is lessened. In some embodiment, due to the formation of the first blocking material layers 114a (oxygen-rich SiCON layers) formed on the surfaces 112b of the spacers 112, the composite structures of the spacers 112 and the first blocking material layers 114a thereon offer low dielectric constants (4.5-5.0), leading to reduced parasitic capacitance and improved operation speed of the device. In some embodiments, the second blocking material layers 114b (oxygen-rich silicon oxide) on the surfaces 130a of the strained source and drain regions 130 cover the impurities and/or dislocations and the electron or hole traps are decreased.

Figure 2F:
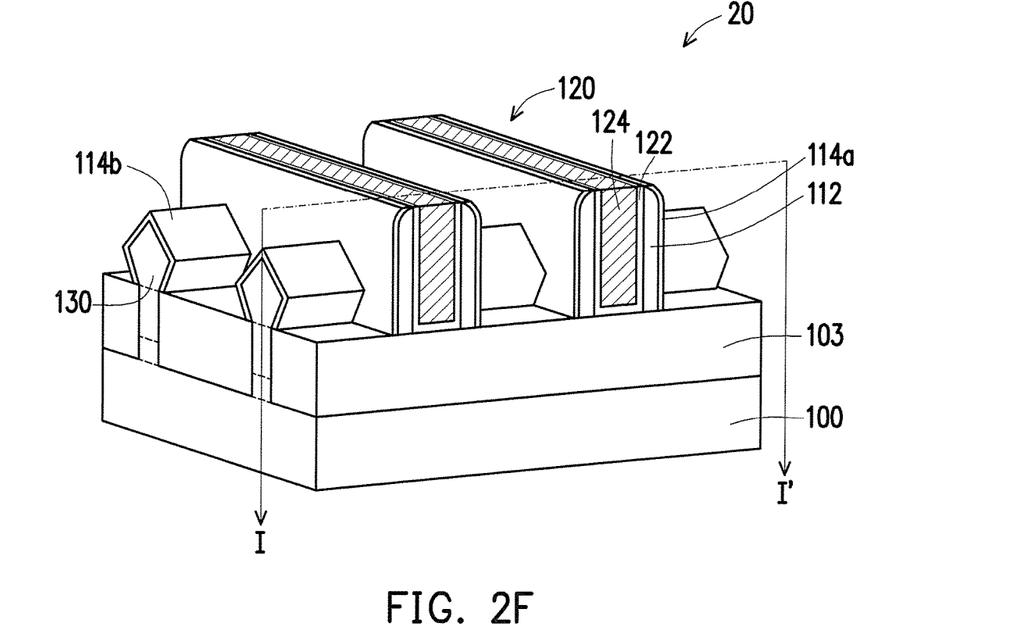
Figure 2G:
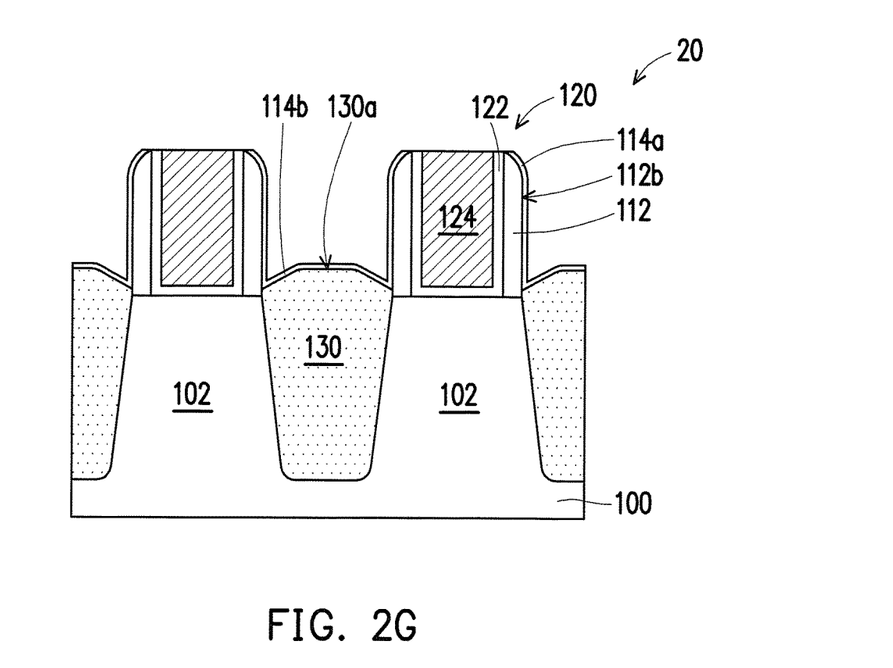

FIG. 2F is a perspective view of the FinFET 20 at one of various stages of the manufacturing method, and FIG. 2G is a cross-sectional view of the FinFET 20 taken along the line I-I' of FIG. 2F. As shown in FIG. 2F and 2G, in some embodiments, the gate structures 120 are formed, after removing the stack structures 110. In one embodiment, after removing the polysilicon strip 106 and the hard mask strip 108 located on the polysilicon strip 106 between the spacers 112 and the first blocking material layers 114a, a gate dielectric layer 122 and a gate electrode layer 124 are sequentially formed within the recesses between the spacers 112 and the first blocking material layers 114a. As shown in FIG. 2F & FIG. 2G, the gate electrode layer 124 and the gate dielectric layer 122 covers portions of the fins 102, and the covered portions function as the channel regions (also labeled as 102). In some embodiments, the material of the gate dielectric layer 122 comprises silicon oxide, silicon nitride or the combination thereof. In some embodiments, the gate dielectric layer 122 comprises a high-k dielectric material, and the high-k dielectric material has a k value greater than about 7.0 and includes a metal oxide or a silicate of Hf, Al, Zr, La, Mg, Ba, Ti, Pb and combinations thereof. In some embodiments, the gate dielectric layer 122 is formed by atomic layer deposition (ALD), molecular beam deposition (MBD), physical vapor deposition (PVD) or thermal oxidation. In some embodiments, the gate electrode layer 124 comprises a metal-containing material, such as Al, Cu, W, Co, Ti, Ta, Ru, TiN, TiAl, TiAlN, TaN, TaC, NiSi, CoSi or a combination thereof. Depending on whether the FinFET 20 is a p-type FinFET or an n-type FinFET, the materials of the gate dielectric layer 122 and/or the gate electrode layer 124 are chosen. Optionally, a chemical mechanical polishing (CMP) process is performed to remove the excess portions of gate dielectric layer 122 and the gate electrode layer 124. The spacers 112 and the first blocking material layers 114a are located on sidewalls of the gate dielectric layer 122 and the gate electrode layer 124. That is, the stack structures 110 are replaced and the replacement gate structure 120 are formed with the spacers 112 and the first blocking material layers 114a at both sides of the gate structure 120. In some embodiments described herein, the gate structure 120 are replacement gates, but the gate structures or the fabrication processes thereof are not limited by these embodiments.

In FIG. 2F and FIG. 2G, in some embodiments, the gate structures 120 are located on the isolation structures 103 and over the substrate 100, and the spacers 112 and the first blocking material layers 114a are located on opposite sidewalls of the gate structures 120. In certain embodiments, the strained source and drain regions 130 are located on two opposite sides of the gate structures 120 and between the isolation structures 103, and the second blocking material layers 114b are located on top surfaces 130a of the strained source and drain regions 130.

Accordingly, as the strained source and drain regions 130 are covered by the second blocking material layers 114b, the second blocking material layers 114b of high quality oxygen-rich oxides lessen the electron or hole traps and reduce the current leakage. The first blocking material layers 114a disposed on the spacers 112 attributes to spacers of low dielectric constant, thus lowering the parasitic capacitance. The performance of the FinFET device is boosted.

Figure 3:
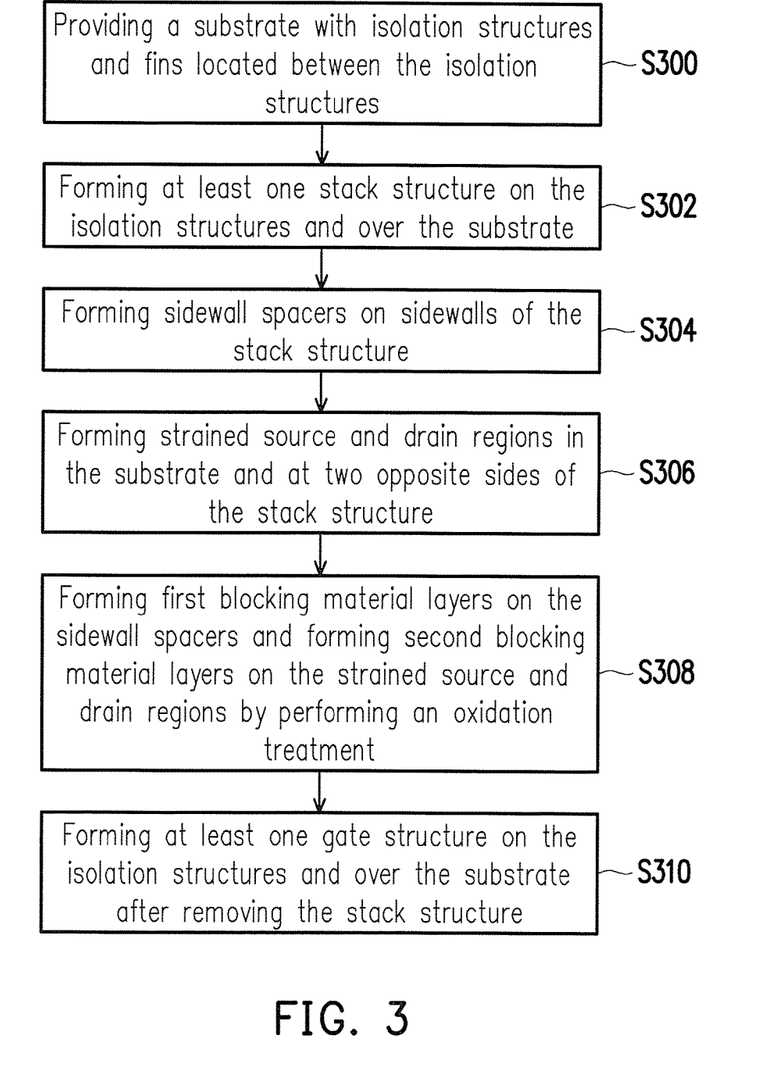
FIG. 3 is an exemplary flow chart showing the process steps of the manufacturing method for forming a FinFET in accordance with some embodiments of the present disclosure.

FIG. 3 is an exemplary flow chart showing some of the process steps of the manufacturing method for forming a FinFET in accordance with some embodiments of the present disclosure.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In Step 300, a substrate with isolation structures and fins located between the isolation structures is provided. In Step 302, at least one stack structure is formed on the isolation structures and over the substrate. The substrate is a silicon substrate or a silicon-on-insulator (SOI) substrate. In Step 304, sidewall spacers are formed on sidewalls of the stack structure. In Step 306, strained source and drain regions are formed in the substrate and at two opposite sides of the stack structure. In Step 308, first blocking material layers are formed on the sidewall spacers and second blocking material layers are formed on the strained source and drain regions by performing an oxidation treatment. In Step 310, at least one gate structure is formed on the isolation structures and over the substrate after removing the stack structure.

In the above embodiments, by performing the oxidation treatment, the first blocking material layers formed on the sidewall spacers and the second blocking material layers formed on the strained source and drain regions includes high quality oxygen-rich oxide materials with negative charges. The first or second blocking material layers resultant from the oxidation treatment can reduce the electron or hole trapping and leakage and offer low dielectric constants, thus reducing the parasitic capacitance and enhancing the device operation speed. For the device having the first or second blocking material layers, the electrical performance of the device is boosted.

In some embodiments of the present disclosure, a fin-type field effect transistor is described. The fin-type field effect transistor comprises a substrate having isolation structures and fins between the isolation structures, at least one gate structure, spacers, first and second blocking material layers and stained source and drain regions. The at least one gate structure is disposed over the substrate and on the isolation structures. The spacers are disposed on sidewalls of the at least one gate structure. First blocking material layers are disposed on the spacers. The strained source and drain regions are disposed at two opposite sides of the at least one gate structure. Second blocking material layers are disposed on the strained source and drain regions. The first and second blocking material layers comprise oxygen-rich oxide materials.

In some embodiments of the present disclosure, a fin-type field effect transistor is described. The fin-type field effect transistor comprises a substrate having isolation structures and fins between the isolation structures, at least one gate structure, spacers, first and second blocking material layers and stained source and drain regions. The at least one gate structure is disposed over the fins and on the isolation structures. The spacers are disposed on sidewalls of the at least one gate structure. First blocking material layers are disposed on surfaces of the spacers. The first blocking material layers comprise negative-charged layers. The strained source and drain regions are disposed at opposite sides of the at least one gate structure. Second blocking material layers are disposed on surfaces of the strained source and drain regions. The second blocking material layers comprise negative-charged silicon oxide layers.

In some embodiments of the present disclosure, a method for forming a fin-type field effect transistor is described. A substrate with isolation structures and fins located between the isolation structures is provided. At least one stack structure is formed on the isolation structures, over the fins and over the substrate. Sidewall spacers are formed on sidewalls of the at least one stack structure. Strained source and drain regions are formed in the substrate and at two opposite sides of the at least one stack structure. First blocking material layers are formed on the sidewall spacers and second blocking material layers are formed on the strained source and drain regions by performing an oxidation treatment. At least one gate structure is formed on the isolation structures, over the fins and over the substrate after removing the stack structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor, comprising:
   a substrate having isolation structures and fins between the isolation structures;
   at least one gate structure, disposed over the substrate and on the isolation structures;
   spacers, disposed on sidewalls of the at least one gate structure;
   first blocking material layers, disposed on the spacers;
   strained source and drain regions, disposed at opposite sides of the at least one gate structure; and
   second blocking material layers, disposed on the strained source and drain regions, wherein the first and second blocking material layers comprise oxygen-rich oxide materials, and an oxygen content of the first blocking material layers is larger than an oxygen content of the spacers, and
   wherein a material of the spacers comprises silicon carbon oxynitride, and a material of the first blocking material layers comprises oxygen-rich silicon carbon oxynitride, or
   wherein a material of the spacers comprises silicon oxide, and a material of the first blocking material layers comprises oxygen-rich silicon oxide.

2. The transistor of claim 1, wherein an oxygen content of the second blocking material layers is larger than an oxygen content of the strained source and drain regions.

3. The transistor of claim 2, wherein a material of the strained source and drain regions comprises silicon germanium or silicon phosphide and a material of the second blocking material layers comprises oxygen-rich silicon oxide.

4. The transistor of claim 3, wherein the oxygen-rich silicon oxide is represented by SiOx and $2.1 \leq x \leq 2.5$.

5. A fin-type field effect transistor, comprising:
   a substrate having isolation structures and fins between the isolation structures;
   at least one gate structure, disposed over the fins and on the isolation structures;
   spacers, disposed on sidewalls of the at least one gate structure;
   first blocking material layers, disposed on surfaces of the spacers, wherein the first blocking material layers comprise negative-charged layers;
   strained source and drain regions, disposed at opposite sides of the at least one gate structure; and
   second blocking material layers, disposed on surfaces of the strained source and drain regions, wherein the second blocking material layers comprise negative-charged silicon oxide layers, and an oxygen content of the second blocking material layers is larger than an oxygen content of the strained source and drain regions.

6. The transistor of claim 5, wherein an oxygen content of the first blocking material layers is larger than an oxygen content of the spacers.

7. The transistor of claim 6, wherein a material of the spacers comprises silicon carbon oxynitride, and the negative-charged layers comprise oxygen-rich silicon carbon oxynitride.

8. The transistor of claim 6, wherein a material of the spacers comprises silicon oxide, and the negative-charged layers comprise oxygen-rich silicon oxide.

9. The transistor of claim 5, wherein a material of the strained source and drain regions comprises silicon germanium or silicon phosphide and a material of the negative-charged silicon oxide layers is represented by SiOx and $2.1 \leq x \leq 2.5$.

10. A method for forming a fin-type field effect transistor, comprising:
    providing a substrate with isolation structures and fins located between the isolation structures;
    forming at least one stack structure on the isolation structures and over the fins;
    forming spacers on sidewalls of the at least one stack structure;

forming strained source and drain regions in the substrate and at two opposite sides of the at least one stack structure;

forming first blocking material layers on the spacers without covering the isolation structures and forming second blocking material layers on the strained source and drain regions without covering the isolation structures by performing an oxidation treatment to surfaces of the spacers and the strained source and drain regions; and forming at least one gate structure on the isolation structures and over the fins after removing the at least one stack structure.

11. The method of claim 10, wherein performing the oxidation treatment comprises performing a low temperature radical oxidation treatment at an operating temperature ranging from 25° C. to 600° C.

12. The method of claim 10, wherein performing the oxidation treatment comprises applying a plasma treatment using at least a gas containing oxygen.

13. The method of claim 12, wherein forming first blocking material layers on the spacers and forming second blocking material layers on the strained source and drain regions comprises treating surfaces of the spacers and the strained source and drain regions by applying the plasma treatment to form the first blocking material layers and the second blocking material layers including oxygen-rich oxide materials.

14. The method of claim 12, wherein forming first blocking material layers on the spacers and forming second blocking material layers on the strained source and drain regions comprises treating surfaces of the spacers and the strained source and drain regions by applying the plasma treatment to form the first blocking material layers and the second blocking material layers including negative-charged layers.

15. The method of claim 10, wherein forming first blocking material layers on the spacers comprises forming oxygen-rich silicon carbon oxynitride layers on the spacers.

16. The method of claim 10, wherein forming second blocking material layers on the strained source and drain regions comprises forming oxygen-rich silicon oxide layers in the strained source and drain regions.

* * * * *